(12) United States Patent
Park et al.

(10) Patent No.: US 10,811,628 B2
(45) Date of Patent: Oct. 20, 2020

(54) PRESS FORMING METHOD FOR COMPOSITE MATERIAL

(71) Applicant: OHSUNG DISPLAY CO., LTD., Busan (KR)

(72) Inventors: Hae Chan Park, Yangju-si (KR); Sun Gyu Kim, Yangju-si (KR)

(73) Assignee: OHSUNG DISPLAY CO., LTD., Busan (KR)

( * ) Notice: Subject to any disclaimer, the term of this patent is extended or adjusted under 35 U.S.C. 154(b) by 91 days.

(21) Appl. No.: 16/297,203

(22) Filed: Mar. 8, 2019

(65) Prior Publication Data

US 2020/0136084 A1 Apr. 30, 2020

(30) Foreign Application Priority Data

Oct. 29, 2018 (KR) .................... 10-2018-0129584

(51) Int. Cl.
*H01L 51/52* (2006.01)
*H01L 27/32* (2006.01)
(Continued)

(52) U.S. Cl.
CPC ............ *H01L 51/5237* (2013.01); *B32B 7/06* (2013.01); *B32B 7/12* (2013.01); *H01L 27/32* (2013.01);
(Continued)

(58) Field of Classification Search
CPC ....... H01L 27/32; H01L 51/5237–5246; H01L 51/56; H01L 2251/10; H01L 2251/50–53;
(Continued)

(56) References Cited

U.S. PATENT DOCUMENTS

2008/0074022 A1* 3/2008 Wang .................. H01L 51/5237
  313/49
2008/0297041 A1* 12/2008 Park ...................... H05B 33/04
  313/504

(Continued)

FOREIGN PATENT DOCUMENTS

KR 10-2014-0094694 A 7/2014
KR 10-2016-0019751 A 2/2016

*Primary Examiner* — Matthew P Travers
(74) *Attorney, Agent, or Firm* — Novick, Kim & Lee, PLLC; Sang Ho Lee

(57) ABSTRACT

Provided is a press forming method for a composite material. A press forming method for a composite material including an upper metal member, a resin member, and a lower metal member, and including: producing the lower metal member having first and second coating films respectively bonded to upper and lower surfaces thereof; producing the composite material including the upper metal member, a first hot melt member, the resin member, a second hot melt member, and the lower metal member; cutting an area spaced inward a predetermined distance from a lengthwise edge of the composite material by using a T-cutter, such that only the lower metal member remains; removing the upper metal member, the first hot melt member, the resin member, and the second hot melt member that are located outside the cut area; and folding the lower metal member by an angle of 180 degrees by using a hemming die.

5 Claims, 6 Drawing Sheets

(51) Int. Cl.
  *H01L 51/56* (2006.01)
  *B32B 7/12* (2006.01)
  *B32B 7/06* (2019.01)
  *B32B 37/26* (2006.01)

(52) U.S. Cl.
  CPC ........ *H01L 51/56* (2013.01); *B32B 2037/268* (2013.01); *H01L 2251/10* (2013.01); *H01L 2251/53* (2013.01); *H01L 2251/56* (2013.01)

(58) Field of Classification Search
  CPC ......... H01L 2251/56; B32B 3/04; B32B 7/05; B32B 7/06; B32B 7/12; B32B 33/00; B32B 2037/1215–123; B32B 2037/268; B32B 38/105; B32B 2457/206; B29L 2031/3475; B29L 2009/003; B21D 5/16; B21D 19/12; B21D 35/005; B21D 35/007; B21D 47/04; B21D 51/2623
  See application file for complete search history.

(56) References Cited

U.S. PATENT DOCUMENTS

| | | | |
|---|---|---|---|
| 2009/0067112 A1* | 3/2009 | Takabayashi | G02F 1/136204 361/220 |
| 2012/0146491 A1* | 6/2012 | Ra | H01L 27/3276 313/512 |
| 2015/0085471 A1* | 3/2015 | Jeon | G02F 1/133608 362/97.2 |
| 2017/0018731 A1* | 1/2017 | Cao | H01L 51/524 |
| 2017/0118859 A1* | 4/2017 | Kang | H05K 5/0017 |
| 2017/0345874 A1* | 11/2017 | Kim | B22C 7/026 |
| 2018/0214922 A1* | 8/2018 | Kim | H01L 27/3244 |
| 2019/0069425 A1* | 2/2019 | Ryu | H01L 51/56 |
| 2019/0132963 A1* | 5/2019 | Yu | H01L 51/529 |

* cited by examiner outward hemming    inward hemming

PRESS FORMING METHOD FOR COMPOSITE MATERIAL

CROSS REFERENCE TO RELATED APPLICATION

The present application claims priority to Korean Patent Application No. 10-2018-0129584, filed Oct. 29, 2018, the entire contents of which is incorporated herein for all purposes by this reference.

BACKGROUND OF THE INVENTION

Field of the Invention

The present invention relates to a press forming method for a composite material, which prevents a longitudinal section of the composite material from being exposed to outside.

Description of the Related Art

In general, an OLED display is a self-luminous display in which each self-luminous pixel can illumine independently, thus requiring no backlight unit. The OLED display is constructed using an encap (encapsulation film), an OLED, a color refiner on TFT (CRT), glass, and an anti-reflection film (ARF).

A typical OLED is composed of two electrodes and an organic layer. When electric power is applied, holes and electrons are injected from the electrodes are injected into the organic layer, and they recombine in the organic layer to form an exciton. The exciton transitions from an excited state to a ground state, leading to emission of light. When oxygen and/or moisture permeates into the OLED, shortening of lifespan and lowering of luminous efficiency are caused. Thus, manufacturing of the OLED display includes an encapsulation process in which an encapsulation structure is formed to encapsulate an OLED panel having an OLED in order to prevent penetration of oxygen and/or moisture.

FIG. 1 is a view showing a typical display structure. As shown in FIG. 1, the display includes a backboard, a cabinet, a pad, and a panel. The bonding of the backboard and the cabinet constituting the display is carried out using a double-sided tape as shown in FIG. 1. In other words, the double-sided tape is placed between the backboard and the cabinet to bond the cabinet to the backboard together.

In other words, a separate cabinet (middle cabinet: M/C) is required in order to prevent side surfaces of the backboard and the pad from being exposed to outside, leading to an increase in manufacturing cost, and a requirement of a separate process.

The foregoing is intended merely to aid in the understanding of the background of the present invention, and is not intended to mean that the present invention falls within the purview of the related art that is already known to those skilled in the art.

SUMMARY OF THE INVENTION

Accordingly, the present invention has been made keeping in mind the above problems occurring in the related art, and an objective of the present invention is to provide a method of preventing the side surface of a pad from being exposed to outside without provision of a separate member.

Another objective of the present invention is to provide a process for providing excellent flatness and stiffness and providing easy finishing of the side surface.

Still another objective of the present invention is to provide a display capable of reducing manufacturing cost.

Yet another objective of the present invention is to provide a composite material capable of enabling both inward hemming and outward hemming.

Yet another objective of the present invention is to provide a method of easily removing a hot melt film from a metal member.

In order to achieve the above objectives, according to one aspect of the present invention, there is provided a press forming method for a composite material including an upper metal member, a resin member, and a lower metal member, the method including: producing the lower metal member having a first coating film and a second coating film respectively bonded to an upper surface and a lower surface thereof; producing the composite material including the upper metal member, a first hot melt member, the resin member, a second hot melt member, and the lower metal member sequentially layered and bonded together; cutting an area spaced inward a predetermined distance from a lengthwise edge of the composite material by using a T-cutter, such that only the lower metal member remains; removing the upper metal member, the first hot melt member, the resin member, and the second hot melt member that are located outside the cut area; and folding the lower metal member by an angle of 180 degrees by using a hemming die such that side surfaces of the upper metal member and the resin member are prevented from being exposed to outside.

According to the press forming method for the composite material according to the present invention, the metal member located at the relatively lowest position is folded by an angle of 180 degrees by using a hemming die (jig) such that a cut surface of the composite material is prevented from being exposed to outside. Thus, the metal member is folded by the angle of 180 degrees using the hemming die such that the cut surface of the composite material is prevented from being exposed to outside in such a way, thereby eliminating a requirement to use a separate middle cabinet.

As described above, since the separate middle cabinet is not used, manufacturing cost is reduced, and a finished appearance is also excellent.

Furthermore, the present invention can produce a composite material that enables both inward hemming and outward hemming. For this purpose, it is possible to easily remove the hot melt member from the metal member.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

The above and other aspects of the present invention will be more clearly understood from the following detailed description when taken in conjunction with the accompanying drawings. Hereinbelow, exemplary embodiments of the present invention will be described in detail with reference to the accompanying drawings such that the invention can be easily embodied by one of ordinary skill in the art to which this invention belongs.

Figure 1:
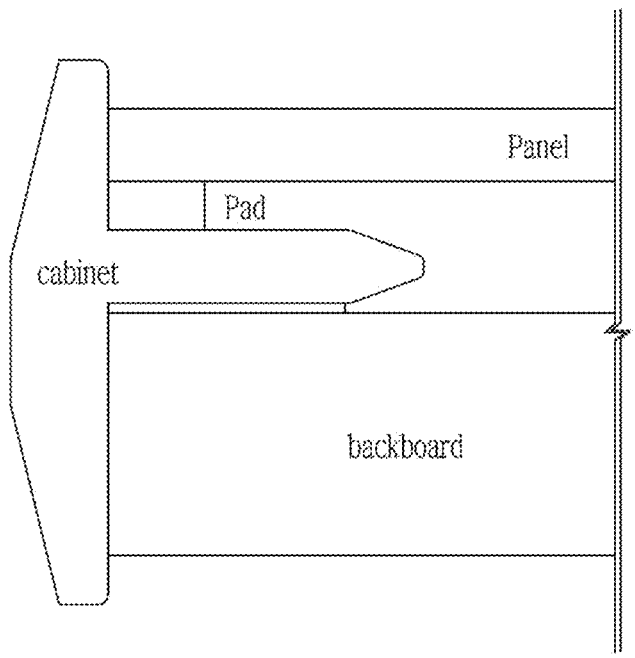
FIG. 1 is a view showing a typical display structure.
Figure 2:
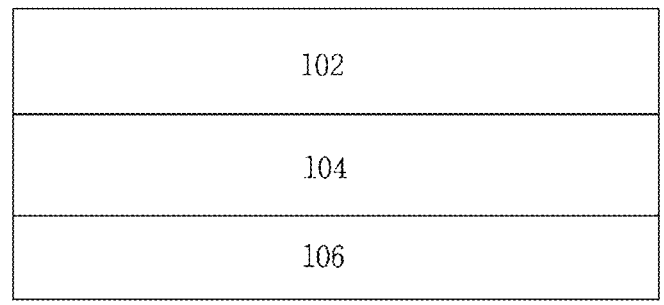
FIG. 2 is a view showing a structure of a composite material according to an embodiment of the present invention.

FIG. 2 is a view showing a composite material according to an embodiment of the present invention. Hereinafter, the composite material according to the embodiment of the present invention will be described in detail with reference to FIG. 2.

As shown in FIG. 2, a composite material 100 includes an upper metal member 102, a resin member 104, and a lower metal member 106. Further, as shown in FIG. 2, longitudinal sections (cut surfaces) of respective materials constituting the composite material form one flat surface.

Figure 3:
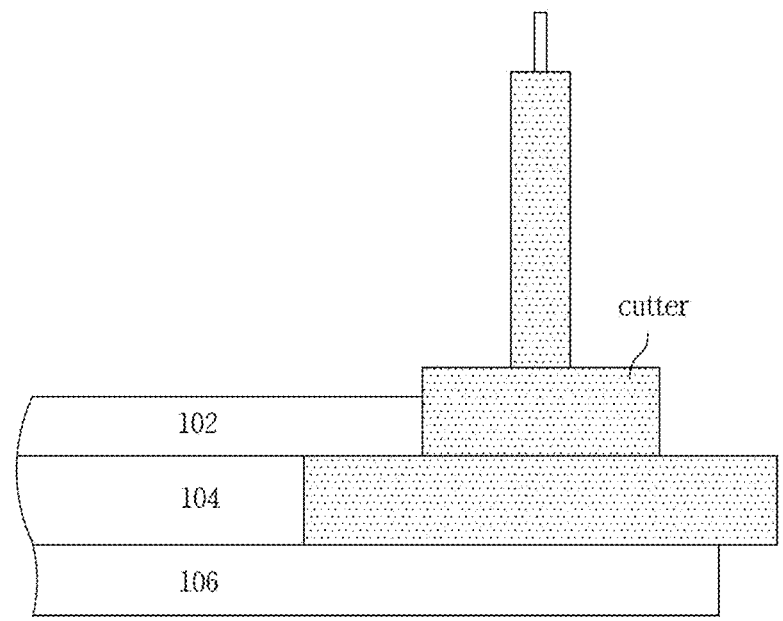
FIG. 3 is a view showing a forming process for the composite material according to an embodiment of the present invention.

FIG. 3 is a view showing a forming process for the composite material according to an embodiment of the present invention. Hereinafter, the method of forming the composite material according to the embodiment of the present invention will be described in detail with reference to FIG. 3.

As described above, a longitudinal section (cut surface) of the composite material 100 forms one flat surface. In this state, the longitudinal section (lengthwise edge) of the composite material is formed using a cutter. As shown in FIG. 3, the cutter is a T-cutter, and the upper metal member 102 and the resin member 104 are cut by using the cutter. In this case, the resin member 104 is relatively more cut than the upper metal member 102. In other words, the resin member 104 is cut by using a portion of the cutter, which has a relatively large diameter, while the upper metal member 102 is cut by using a portion of the cutter, which has a relatively small diameter. The upper metal member 102 and the resin member 104 of the composite material are cut by using the cutter as shown in FIG. 3.

Figure 4:
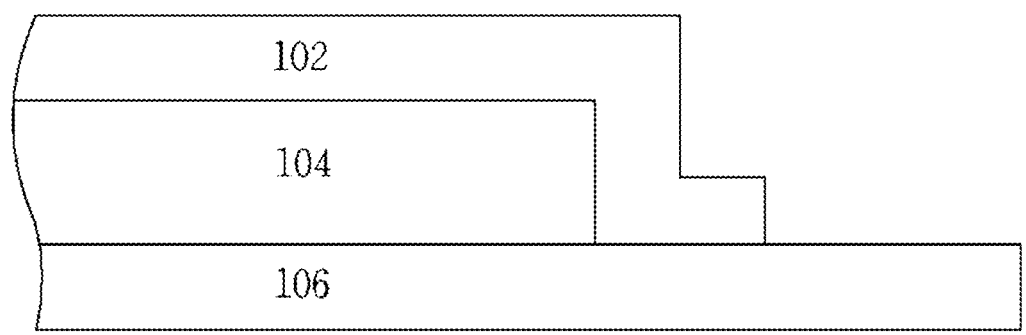
FIG. 4 is a view showing a forming process for the composite material according to the embodiment of the present invention after cutting an upper metal member and a resin member.

FIG. 4 is a view showing a forming process for the composite material according to the embodiment of the present invention after cutting the upper metal member and the resin member. Hereinafter, the method of forming the composite material according to the embodiment of the present invention after cutting the upper metal member and the resin member will be described with reference to FIG. 4.

As shown in FIG. 4, the upper metal member 102, which protrudes relatively more than the resin member 104, is bent toward the lower metal member 106. As the upper metal member 102 is bent toward the lower metal member 106, the longitudinal section of the resin member 104 is brought into close contact with the upper metal member 102. FIG. 4 shows a state in which the upper metal member 102 is in fully close contact with the longitudinal surface of the resin member 104. In particular, the bent upper metal member 102 is in close contact with an upper surface of the lower metal member 106. In other words, the upper metal member 102 has two bent portions. Of course, depending on the protruding length of the upper metal member 102, the upper metal member 102 may have one bent portion.

Figure 5:
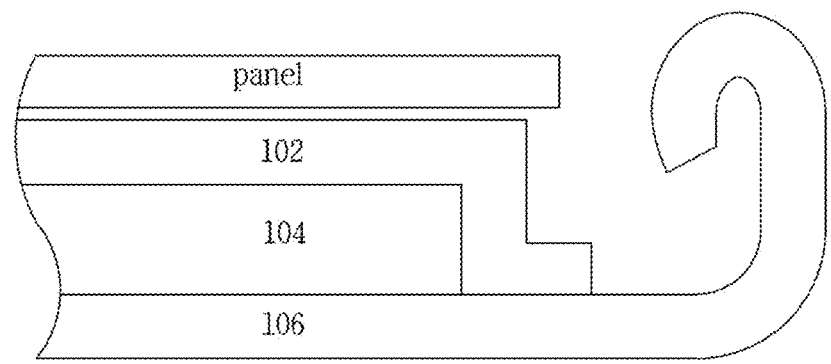
FIG. 5 is a view showing a forming process for the composite material according to the embodiment of the present invention after folding the upper metal member.

FIG. 5 is a view showing a forming process for the composite material according to the embodiment of the present invention after bending the upper metal member. Hereinafter, the method of forming the composite material according to the embodiment of the present invention will be described in detail with reference to FIG. 5.

As shown in FIG. 5, after bending the upper metal member 102, the lower metal member 106 is folded by an angle of 180 degrees by using a hemming die (press). By thus folding the lower metal member 106 by an angle of 180 degrees using the hemming die, the longitudinal section of the composite material is prevented from being exposed to outside.

As described above, the lower metal member 106 is folded by an angle of 180 degrees using the hemming die, whereby it is not necessary to perform a process of preventing the lengthwise edge of the resin member 104 from being exposed to outside by using a separate member (middle cabinet: M/C) such that the lengthwise edge (longitudinal section) of the composite material is prevented from being exposed to outside.

Figure 6:
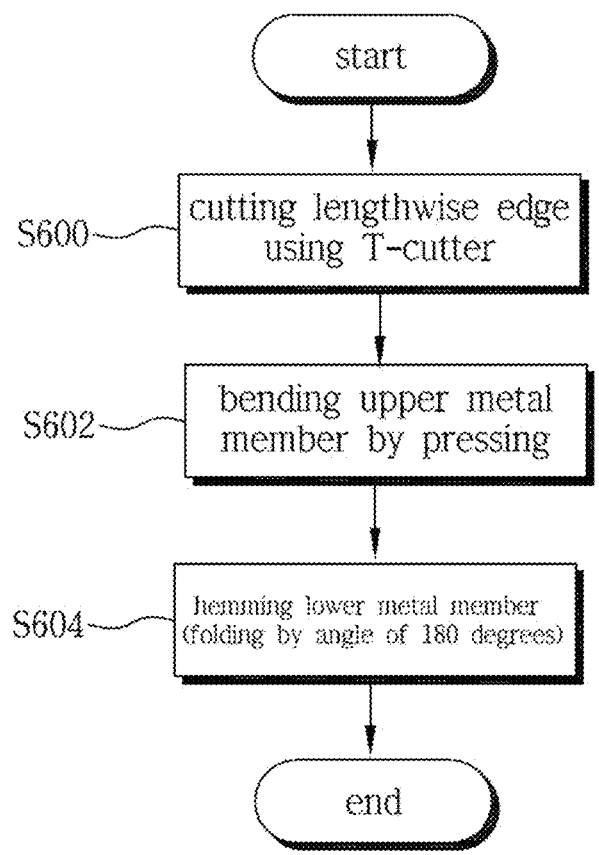
FIG. 6 is a flowchart showing the forming processes for the composite material according to the embodiment of the present invention.

FIG. 6 is a flowchart showing the forming processes for the composite material according to the embodiment of the present invention. Hereinafter, the method of forming the composite material according to the embodiment of the present invention will be described in detail with reference to FIG. 6.

In step S600, the composite material composed of the upper metal member 102, the resin member 104, and the lower metal member 106 is cut by using a T-cutter such that the lengthwise edges of the upper metal member 102 and the resin member 104 are cut. In this case, the resin member 104 is relatively more cut than the upper metal member 102.

In step S602, the upper metal member 102, which is relatively less cut than the resin member 104, is bent toward the lower metal member 106. In this case, the upper metal member 102 may have one or two bent portions depending on the protruding length thereof from the resin member 104 and the thickness of the resin member 104.

In step S604, the lower metal member 106 is folded by an angle of 180 degrees using the hemming die to prevent the lengthwise edge of the composite material from being exposed to outside.

As described above, according to the present invention, the lower metal member 106 is folded by an angle of 180 degrees using the hemming die, whereby the lengthwise edge of the resin member 104 is prevented from being exposed to outside without provision of a separate member.

Figure 7:
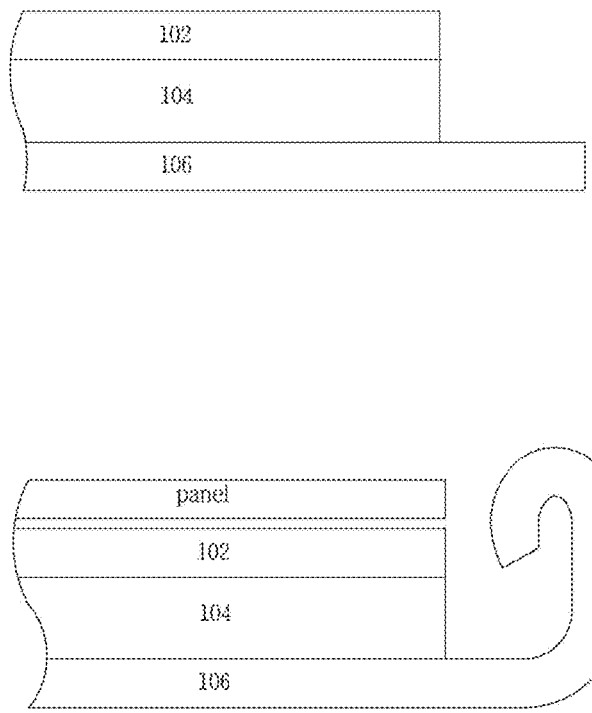
FIG. 7 is a view showing a forming method for a composite material according to another embodiment of the present invention.

FIG. 7 is a view showing a forming method for a composite material according to another embodiment of the present invention. As shown in FIG. 7, the composite material includes an upper metal member 102, a resin member 104, and a lower metal member 106. In FIG. 3, the upper metal member 102 and the resin member 104 are cut by using a cutter in which the resin member 104 is relatively more cut than the upper metal member 102. On the other hand, in FIG. 7, the upper metal member 102 and the resin member 104 are cut equally, and the bending of the upper metal member 102 is not performed. However, in FIG. 7, the bending of the lower metal member 106 by an angle of 180 degrees using the hemming die is performed in the same manner. Thus, in FIG. 7, the lengthwise edge (cut surface, longitudinal section) of the upper metal member 102 and the lengthwise edge (cut surface, longitudinal section) of the resin member 104 are also prevented from being exposed to outside by the lower metal member 106, whereby it is not necessary to perform a process of preventing the longitudinal section of the composite material from being exposed to outside using a separate member.

In the present invention, a composite material composed of an upper metal member, a resin member, and a lower metal member is mentioned, but is not limited thereto. The present invention can be applied to various types of composite materials such as a composite material made of stainless steel (STS)-aluminum-stainless steel (STS), a composite material made of aluminum-steel plate cold commercial (SPCC)-aluminum, etc. In other words, the present invention can be applied to various materials such that the longitudinal section of a composite material having a laminated structure is prevented from being exposed to outside. In this case, the above-mentioned effect can be obtained by folding a material located at the lowest position by an angle of 180 degrees using the hemming die.

Although not described in the above invention, the upper metal member and the resin member are bonded to each other by a first hot melt member (first hot melt film) interposed therebetween. The resin member and the lower metal member are bonded to each other by a second hot melt member (second hot melt film) interposed therebetween.

Furthermore, because a coating film is not bonded between the resin member and the lower metal member in a state where the resin member and the lower metal member are bonded to each other by the second hot melt member, only inward hemming is possible for the lower metal member. Accordingly, there is a demand for methods of hemming the lower metal member inwardly and outwardly using the hemming die.

Figure 8:
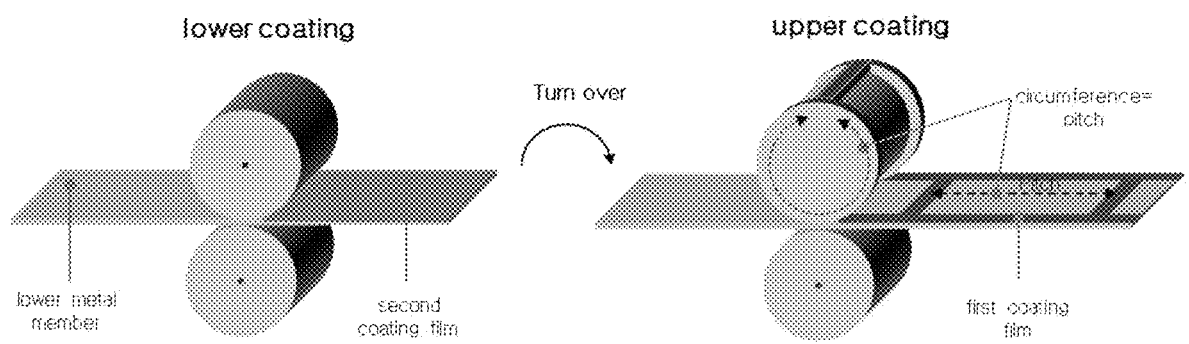
FIG. 8 is a view showing a method of bonding a first coating film and a second coating film to a lower metal member according to the embodiment of the present invention.

FIG. 8 is a view showing a method of bonding the first coating film and the second coating film to the lower metal member according to the embodiment of the present invention. Hereinafter, the method of bonding the first coating film and the second coating film to the lower metal member according to the embodiment of the present invention will be described in detail with reference to FIG. 8.

Referring to FIG. 8, the second coating film is bonded to a lower surface of the lower metal member, and the first coating film is bonded to an upper surface thereof. The second coating film is entirely bonded to the lower surface of the lower metal member while the first coating film is partially bonded to the upper surface of the lower metal member in a ladder shape. In other words, the first coating film is bonded to opposite sides of the lower metal member in a first direction and is bonded in a second direction perpendicular to the first direction at locations spaced apart from each other at a predetermined interval.

In more detail, the second coating film is bonded to the lower surface of the lower metal member, and then the lower metal member is turned over to bond the first coating film to the upper surface of the lower metal member.

Figure 9:
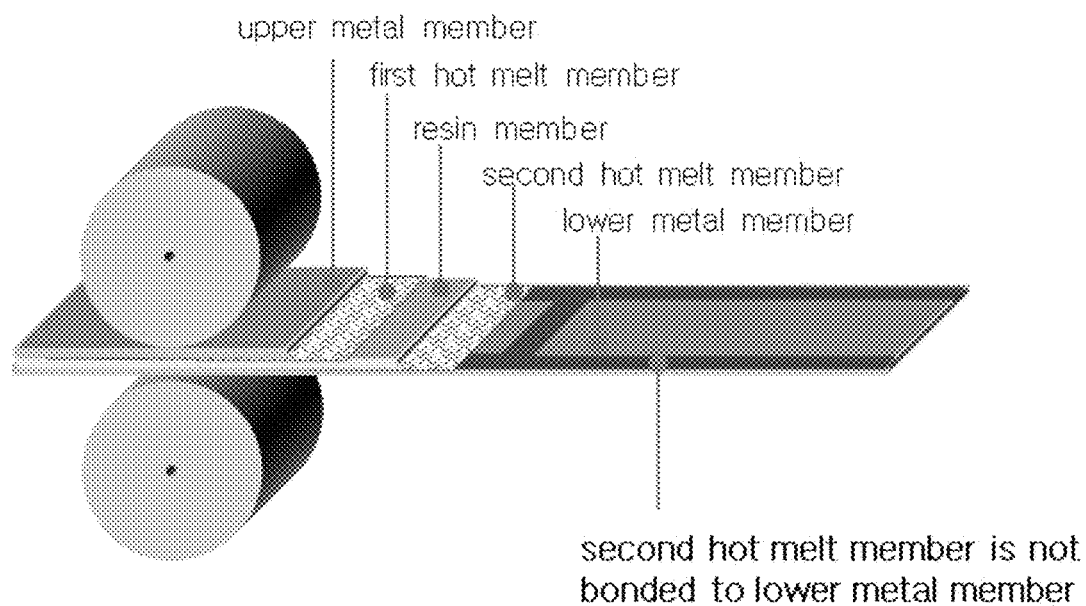
FIG. 9 is a view showing configuration of the composite material according to the embodiment of the present invention.

FIG. 9 is a view showing configuration of the composite material according to the embodiment of the present invention. According to FIG. 9, the composite material includes the upper metal member, the first hot melt member, the resin member, the second hot melt member, and the lower metal member that are sequentially layered downward and bonded together. As described above, the lower metal member has the first metal coating film bonded to the upper surface thereof, and the second coating film bonded to the lower surface thereof. Furthermore, the first coating film prevents the second hot melt film from being directly bonded to the lower metal member at a portion to which the first coating film is bonded.

The composite material is then cut at predetermined intervals using a cutter. In other words, the composite material is cut in the second direction using the cutter, and in particular, an intermediate portion of the first coating film formed in the second direction is cut, thus producing a rectangular composite material.

Figure 10:
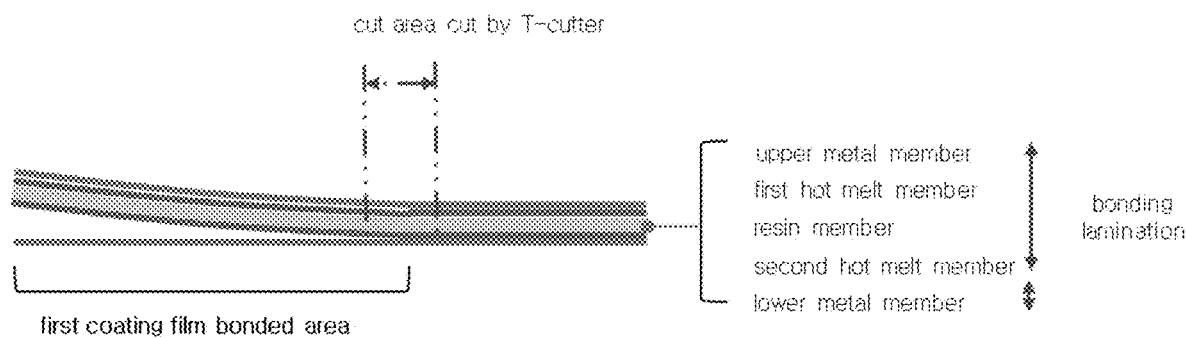
FIG. 10 is a view showing a cut area of the composite material that is cut by using a T-cutter according to the embodiment of the present invention.

FIG. 10 is a view showing a cut area of the composite material that is cut by using the T-cutter according to the embodiment of the present invention. Hereinafter, details of cutting the composite material using the T-cutter according to the embodiment of the present invention will be described in detail with reference to FIG. 10.

Referring to FIG. 10, the cut area of the composite material is cut by using the T-cutter to remove a predetermined width relative to the junction between the portion to which the first coating film is bonded and another portion to which the first coating film is not bonded. Herein, not all the portions of the cut area are cut, but the portions of the cut area are cut such that only the lower metal member remains.

The second hot melt member provided at the lengthwise edge of the composite material is removed in a state where the cut area is cut such that only the lower metal member remains. As described above, since the second hot melt member is not bonded to the first coating film (or the lower metal member) due to provision of the first coating film, it is possible to easily remove the second hot melt member from the lower metal member. When the second hot melt member is removed, the resin member, the first hot melt member, and the upper metal member located at the top of the second hot melt member are also removed.

FIG. 10 is a view showing a state where the second hot melt member is removed from the composite material. In the composite material from which the second hot melt member is removed, only the lower metal member having the first coating film bonded to the upper surface thereof and the second coating film bonded to the lower surface thereof remains.

Figure 11:
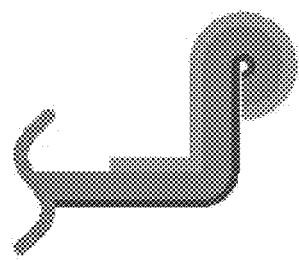
FIG. 11 is a view showing an example of hemming the lower metal member using a hemming die according to the embodiment of the present invention.
Figure 11:
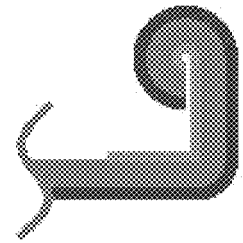

FIG. 11 shows an example of hemming the lower metal member using the hemming die according to an embodiment of the present invention. As shown in FIG. 11, since the lower metal member has the first and second coating films that are respectively bonded to the upper and lower surfaces thereof, both inward hemming and outward hemming using the hemming die are possible.

Although the exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A press forming method for a composite material including an upper metal member, a resin member, and a lower metal member, the method comprising:
    producing the lower metal member having a first coating film and a second coating film respectively bonded to an upper surface and a lower surface thereof;
    producing the composite material including the upper metal member, a first hot melt member, the resin member, a second hot melt member, and the lower metal member sequentially layered and bonded together;
    removing the upper metal member, the first hot melt member, the resin member, and the second hot melt member from an area spaced inward a predetermined distance from a lengthwise edge of the composite material by cutting using a T-cutter, such that only the lower metal member remains in the area; and
    folding the lower metal member by an angle of 180 degrees by using a hemming die such that the lower metal member extends toward the upper metal member adjacent to side surfaces of the upper metal member and the resin member;
    wherein the second coating film is entirely bonded to the lower surface of the lower metal member while the first coating film is partially bonded to the upper surface of the lower metal member.

2. The method of claim 1, wherein the first coating film is bonded to opposite sides of the lower metal member in a first direction and is bonded in a second direction perpendicular to the first direction at locations spaced apart from each other at a predetermined interval.

3. The method of claim 2, wherein after the producing the composite material,
    the composite material is cut along a center line of the first coating film bonded in the second direction by using a cutter, thus producing a rectangular composite material.

4. The method of claim 3, wherein in the cutting using the T-cutter such that only the lower metal member remains in the area, the area is cut to remove a predetermined width including a portion to which the first coating film is bonded and another portion to which the first coating film is not bonded.

5. A composite material formed by the method of claim 1.

* * * * *